United States Patent
Jung

(10) Patent No.: US 6,977,201 B2
(45) Date of Patent: Dec. 20, 2005

(54) METHOD FOR FABRICATING FLASH MEMORY DEVICE

(75) Inventor: Jin Hyo Jung, Bucheon-si (KR)

(73) Assignee: Dongbuanam Semiconductor Inc., Seoul (KR)

(*) Notice: Subject to any disclaimer, the term of this patent is extended or adjusted under 35 U.S.C. 154(b) by 0 days.

(21) Appl. No.: 10/747,619

(22) Filed: Dec. 30, 2003

(65) Prior Publication Data

US 2005/0074937 A1  Apr. 7, 2005

(30) Foreign Application Priority Data

Oct. 6, 2003 (KR) .................... 10-2003-0069217

(51) Int. Cl.[7] .............................................. H01L 21/336
(52) U.S. Cl. ..................... 438/263; 438/264; 438/257
(58) Field of Search .............................. 438/263, 264, 438/257–267, 238, 381

(56) References Cited

U.S. PATENT DOCUMENTS 5,969,384 A * 10/1999 Hong ...................... 257/322
6,287,988 B1 * 9/2001 Nagamine et al. .......... 438/770
6,329,245 B1 * 12/2001 Da et al. .................... 438/264
6,384,448 B1 * 5/2002 Forbes ....................... 257/315
6,456,535 B2 * 9/2002 Forbes et al. ........... 365/185.28
6,781,876 B2 * 8/2004 Forbes et al. ........... 365/185.01

FOREIGN PATENT DOCUMENTS

KR  1020030050999  6/2003

* cited by examiner

Primary Examiner—David Nhu
(74) Attorney, Agent, or Firm—Pillsbury Winthrop Shaw Pittman LLP

(57) ABSTRACT

A method for fabricating a flash memory includes forming a tunnel oxide layer by depositing a material with a conduction band energy level lower than that of $SiO_2$ on a semiconductor substrate; forming a floating gate by depositing polysilicon on the tunnel oxide layer; forming an intergate dielectric layer on the floating gate; forming a control gate on the intergate dielectric layer; forming a gate electrode by patterning the tunnel oxide layer, the floating gate, the intergate dielectric layer and the control gate; and forming a source/drain region by implanting impurities into the substrate using the gate electrode as a mask.

5 Claims, 4 Drawing Sheets

Fig. 1a        Prior Art
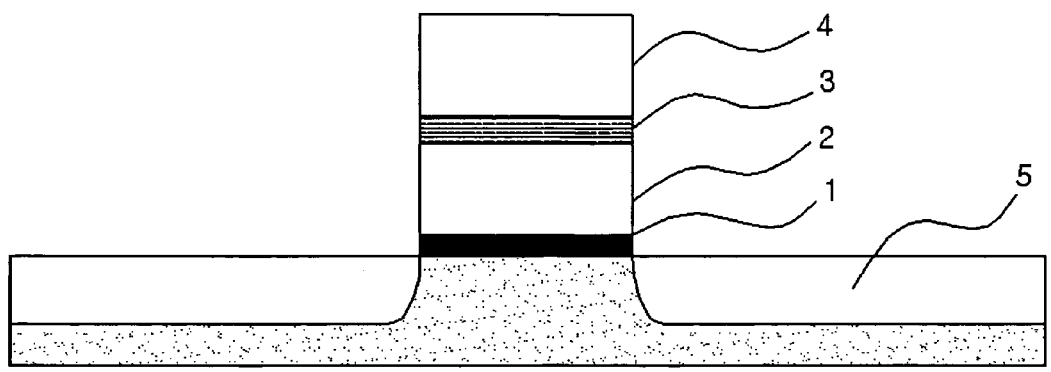
Fig. 1b        Prior Art
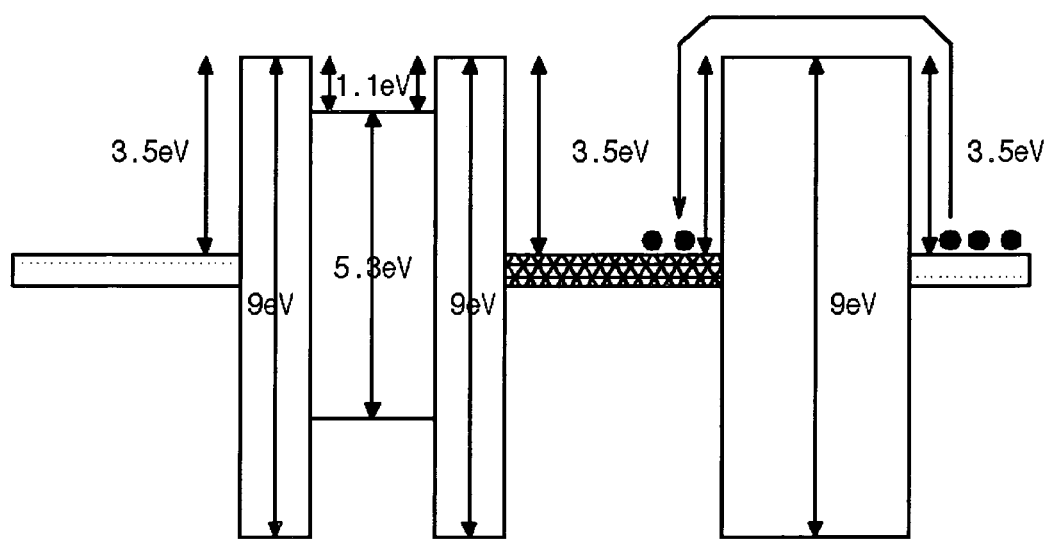

METHOD FOR FABRICATING FLASH MEMORY DEVICE

BACKGROUND OF THE INVENTION

1. Field of the Invention

The present invention relates to a method for fabricating a flash memory device and, more particularly, to a flash memory device whose characteristics are improved by increasing efficiency of hot electron injection via changing a conduction band energy level of a tunnel oxide layer.

2. Background of the Related Art

FIG. 1a shows a conventional floating gate device. The conventional floating gate device can be fabricated as follows. First, $SiO_2$ 1 as a tunnel oxide layer is grown on a P-type silicon substrate. Then, a polysilicon floating gate 2 is deposited on the tunnel oxide layer. Next, an ONO (Oxide-Nitride-Oxide) layer 3 is deposited on the polysilicon floating gate in most cases to increase a coupling ratio. Thereafter, a gate is made by forming and patterning a control gate 4. Finally, a source/drain impurity region 5 is formed in the silicon substrate by performing an ion implantation process using the gate as a mask.

FIG. 1b illustrates an energy band diagram of the conventional floating gate device. In the floating gate device, a 'program' operation increases a threshold voltage by confining electrons in a potential well formed between the floating gate, the tunnel oxide layer, and the ONO layer by hot electron injection. On the contrary, an 'erase' operation decreases the threshold voltage by transferring the electrons confined in the potential well to the P-type silicon substrate by direct tunneling or F/N (Fowler-Nordheim) tunneling. Such a floating gate device has very fast program speed, good retention characteristics, and a wide threshold voltage window. Therefore, floating gate devices are now employed for most commercial non-volatile memories.

However, for a floating gate device using $SiO_2$ as a tunnel oxide layer, the efficiency of hot electron injection is relatively low due to a high potential barrier of 3.5 eV formed between the tunnel oxide layer and the P-type substrate. In addition, high energy of an electron sufficient for jumping the potential barrier is completely lost while injecting the electron into the potential well formed in the floating gate. The energy loss generates a trap on the interface of the tunnel oxide layer, thereby changing the threshold voltage of the floating gate device. Consequently, frequent operations of a read and a write cause degradation of characteristics of the floating gate device. Moreover, thickness of the tunnel oxide layer should be about 80 to 100 Å to guarantee retention characteristics. During an erase operation, as the tunneling length of an electron is very long in the tunnel oxide layer, an erase voltage is so high and an erase time is so long that an erase characteristic becomes poor.

Korean Published Patent No. 2003-50999, Park, discloses a flash memory device enhancing characteristics of a program and erase operations by enlarging the contact region between the floating gate and the control gate. Further, U.S. Pat. No. 6,456,535, Forbes et al., and U.S. Pat. No. 6,384,448, Forbes, disclose methods for enhancing program characteristics by increasing hot electron injection via depositing a very thin tunnel oxide layer of thickness of less than 50 Å. However, the thinner the thickness of the tunnel oxide layer is, the poorer the retention characteristics are.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 1a and 1b illustrate a cross-sectional view and an energy band diagram of a conventional floating gate device.

DETAILED DESCRIPTION OF THE PREFERRED EMBODIMENT

The present invention is directed to a method for fabricating a flash memory device that substantially obviates one or more problems due to limitations and disadvantages of the related art.

An object of the present invention is to provide a method for fabricating a flash memory device which improves characteristics of program, erase, retention and endurance by enhancing efficiency of hot electron injection.

To achieve the object, the present invention provides a method for fabricating a flash memory device, the method comprising the steps of:

forming a tunnel oxide layer by depositing a material with a conduction band energy level lower than that of $SiO_2$ on a semiconductor substrate;

forming a floating gate by depositing polysilicon on the tunnel oxide layer;

forming an intergate dielectric layer on the floating gate;

forming a control gate on the intergate dielectric layer;

forming a gate electrode by patterning the tunnel oxide layer, the floating gate, the intergate dielectric layer, and the control gate; and forming a source/drain region by implanting impurities into the substrate using the gate electrode as a mask.

References will now be made in detail to the preferred embodiments of the present invention, examples of which are illustrated in the accompanying drawings.

Figure 2A:
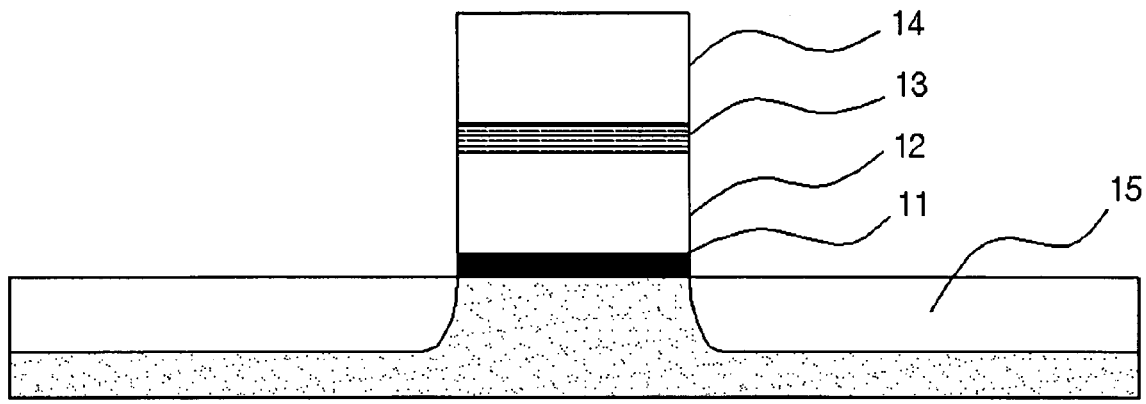
FIGS. 2a and 2b illustrate a cross-sectional view and an energy band diagram of a floating gate device according to an embodiment of the present invention.

FIG. 2a illustrates a cross-sectional view of a floating gate device according to an embodiment of the present invention. The floating gate according to the present invention can be fabricated as follows. First, a tunnel oxide layer 11 with a conduction band energy level lower than that of $SiO_2$ is grown on a P-type silicon substrate. Then, a polysilicon floating gate 12 is deposited on the oxide layer. Next, an intergate dielectric layer 13 is deposited on the polysilicon floating gate to increase a coupling ratio as in the conventional floating gate device. Thereafter, a gate electrode is made by forming a control gate 14 on the intergate dielectric layer and patterning the deposited layers. Finally, an ion implantation process is performed using the gate electrode as a mask to form a source/drain impurity region 15 in the P-type silicon substrate. A material with a high dielectric constant such as $Y_2O_3$, $Al_2O_3$, $HfO_2$, or $ZrO_2$ is preferable as the tunnel oxide layer. An ONO layer is preferable for the intergate dielectric layer.

Figure 2B:
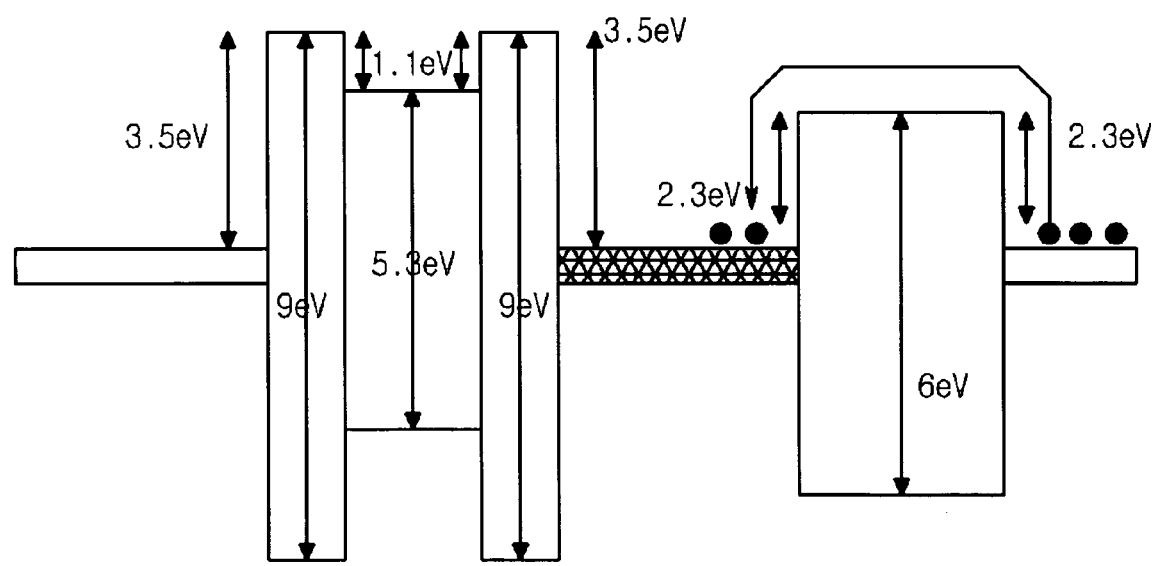

FIG. 2b illustrates an energy band diagram of a floating gate device using $Y_2O_3$ as the tunnel oxide layer. A potential barrier between the tunnel oxide layer and the P-type substrate is 2.3 eV. Because the potential barrier is 1.2 eV lower than that of $SiO_2$ as the traditional tunnel oxide layer, program speed is improved by a great increase in efficiency of hot electron injection. Further, as about 2.3 eV is required for an electron to jump the potential barrier, the amount of energy lost when the electron is injected into a potential well formed in the floating gate is also 2.3 eV which is 1.2 eV lower than that for $SiO_2$. Consequently, a change in a threshold voltage of a floating gate device caused by a trap formed with repeated read and write operations is also decreased. That is, an endurance characteristic, i.e., the maximum number of data write and erase operations is enhanced.

Figure 3A:
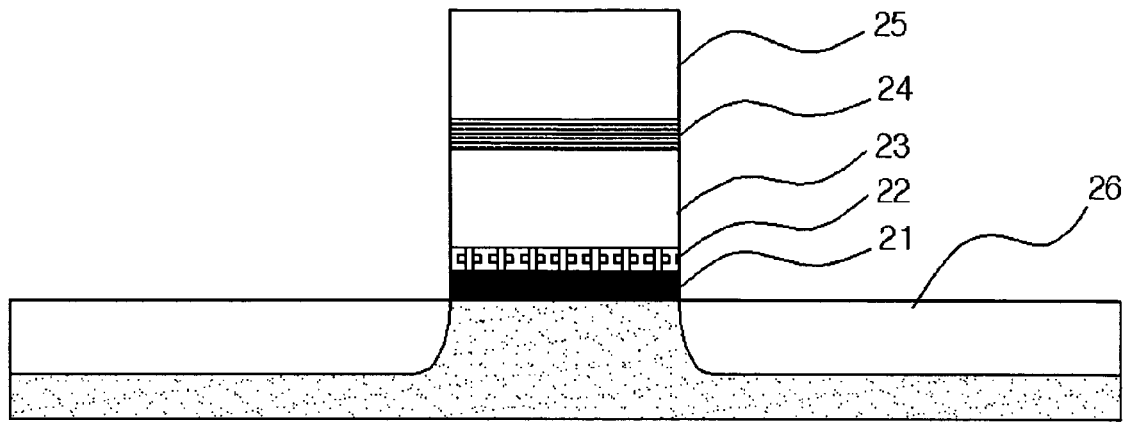
FIGS. 3a through 3d illustrate a cross-sectional view and an energy band diagram of a floating gate device according to another embodiment of the present invention.

FIG. 3a illustrates a cross-sectional view of a floating gate device according to another embodiment of the present invention. The floating gate according to the present invention can also be fabricated as follows. First, a first tunnel oxide layer 21 with a conduction band energy level lower than that of $SiO_2$ is grown on a P-type silicon substrate. Then, a second tunnel oxide layer 22 with a conduction band energy level equal or similar to that of $SiO_2$ as the second tunnel oxide layer is deposited on the first oxide layer. Next, a polysilicon floating gate 23 is deposited on the second tunnel oxide layer. And an intergate dielectric layer 24 is deposited on the polysilicon floating gate to increase a coupling ratio as in the conventional floating gate device. Thereafter, a gate electrode is made by forming a control gate 25 on the intergate dielectric layer and patterning the deposited layers. Finally, an ion implant process is performed using the gate electrode as a mask to form a source/drain impurity region 26 in the P-type silicon substrate. A material with a high dielectric constant such as $Y_2O_3$, $Al_2O_3$, $HfO_2$, or $ZrO_2$ is preferable as the first tunnel oxide layer and a material such as $Y_2O_3$, $Al_2O_3$, or $SiO_2$ is preferable as the second tunnel oxide layer. An ONO layer is preferable for the intergate dielectric layer.

Figure 3B:
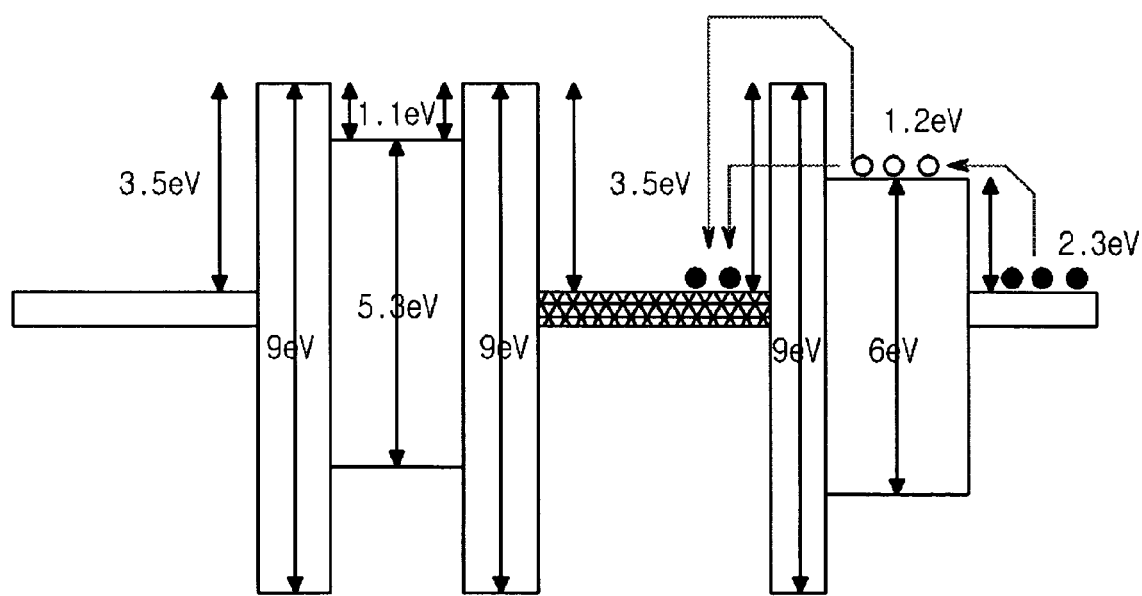

FIG. 3b illustrates an energy band diagram of the floating gate device using $Al_2O_3$ as the first tunnel oxide layer and $SiO_2$ as the second tunnel oxide. A potential barrier between the first tunnel oxide layer and the P-type substrate is 2.3 eV. Because the potential barrier is 1.2 eV lower than that of $SiO_2$ as a traditional tunnel oxide layer, efficiency of hot electron injection increases greatly.

Among electrons injected into a conduction band of the first tunnel oxide layer, those which have enough additional energy to jump the potential barrier of 1.2 eV formed between the first and second tunnel oxide layers can jump the second tunnel oxide layer to be injected into a potential well formed in the floating gate. And, among electrons incapable of jumping the second tunnel oxide layer, some undergo F/N or direct tunneling through the second tunnel oxide layer to be injected into the potential well formed in the floating gate, and others return to the P-type substrate.

Compared to the prior arts using $SiO_2$ as a tunnel oxide layer, electrons in the present invention are injected into the potential well formed in the floating gate by F/N or direct tunneling as well as hot electron injection, so that program speed of the present invention is faster than that of prior arts.

As the second tunnel oxide layer gets thicker, program speed by a tunneling method decreases. Therefore, the second tunnel oxide layer is deposited as thinly as possible. On the contrary, as the thickness of the first tunnel oxide layer does not have any influence on the program speed, the first tunnel oxide layer is deposited as thickly as possible to improve retention characteristics.

In the present invention, although electrons jumping the second tunnel oxide layer lose about 3.5 eV, which is the same as in the conventional floating gate device, electrons tunneling through the second tunnel oxide layer lose only about 2.3 eV. Therefore, the amount of lost energy decreases. Consequently, a change in a threshold voltage of a floating gate device caused by a trap formed with repeated read and write operations is also decreased. That is, endurance characteristics are enhanced.

Figure 3C:
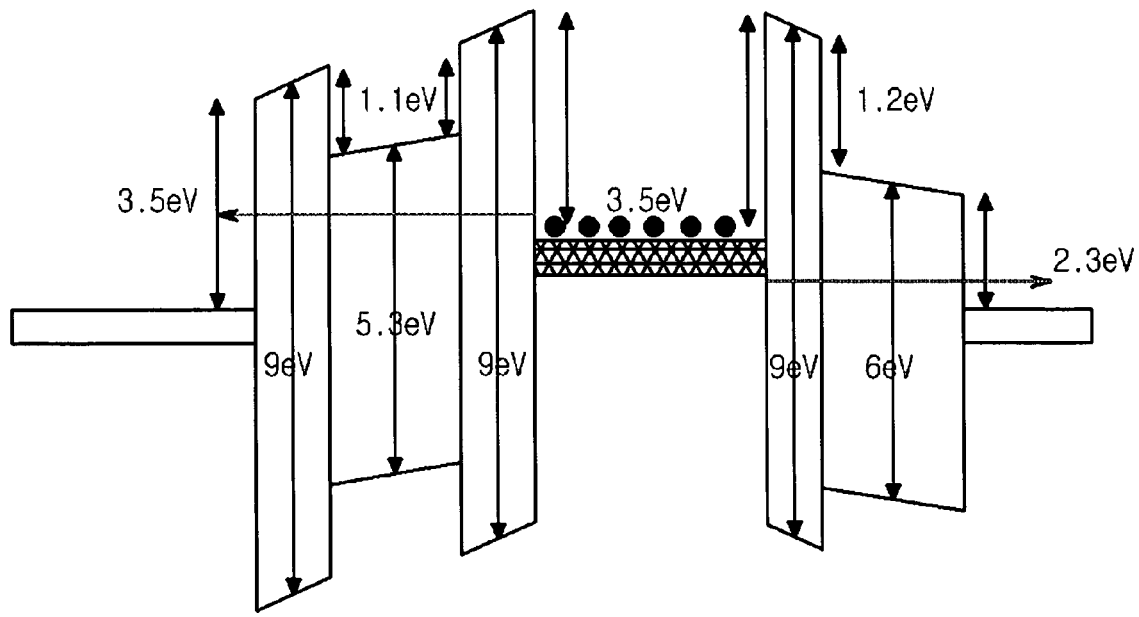

FIG. 3c illustrates an energy band diagram for a retention mode of a floating gate device using $Al_2O_3$ as the first tunnel oxide layer and $SiO_2$ as the second tunnel oxide. There are three ways for electrons confined in the potential well of the floating gate to move out to a conduction band of the P-type substrate or the control gate: jumping the potential barrier of 3.5 eV formed in $SiO_2$, tunneling between the first and second tunnel oxide layers, and tunneling the intergate dielectric layer. However, as it is very rare in the retention mode that electrons confined in the potential well of a floating gate to move out to the conduction band of the P-type substrate or the control gate, retention characteristics are enhanced.

Figure 3D:
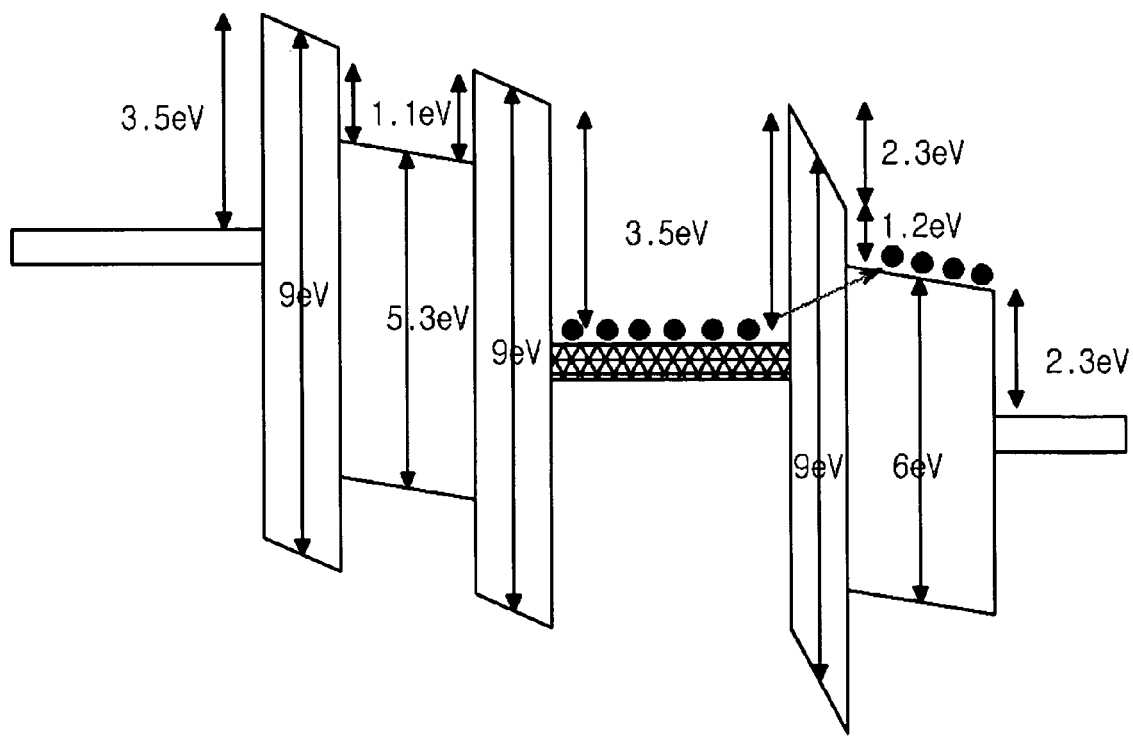

FIG. 3d illustrates an energy band diagram for an erase mode of a floating gate device using $Y_2O_3$ as the first tunnel oxide layer and $SiO_2$ as the second tunnel oxide. In case of using $SiO_2$ as a tunnel oxide layer, erase characteristics become poor as a voltage and time for the erase are increased due to very long tunneling length. In the present invention, an erase voltage applied to the control gate is maintained so that a voltage drop is more than 2.3 eV in the second tunnel oxide layer. Then, if electrons which are confined in the potential well formed in the floating gate succeed only in direct tunneling through the second tunnel oxide layer, they can be injected into a conduction band of the first tunnel oxide layer to move out to a conduction band of the P-type substrate. Therefore, the erase speed is enhanced by the decrease in the tunneling length in comparison with that of the traditional floating gate device using $SiO_2$ as a tunnel oxide layer.

Thus, a method for fabricating a flash memory device according to the present invention enables injection of electrons into a potential well formed in a floating gate by F/N or direct tunneling as well as hot electron injection by using a tunnel oxide layer with a conduction band energy level lower than that of $SiO_2$ used conventionally or by using a first tunnel oxide layer with a conduction band energy level lower than that of $SiO_2$ and a second tunnel oxide layer with a conduction band energy level equal or similar to that of $SiO_2$. Consequently, a program speed of the present invention is faster than that of the prior arts. In addition, the amount of energy lost during the injection of electrons into the potential well formed in the floating gate decreases. Accordingly, endurance characteristics featured by a change in a threshold voltage of a floating gate device by a trap formed by repeated read and write operations are also enhanced.

In addition, retention characteristics are enhanced because it is very rare that electrons confined in the potential well of the floating gate move out to a conduction band of a P-type substrate or a control gate. Moreover, erase speed is enhanced as tunneling length for electrons confined in the potential well formed in the floating gate decreases.

In conclusion, the present invention can enhance program, erase, retention, and endurance characteristics of a flash memory device by the increase in efficiency of hot electron injection.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a flash memory device comprising:

forming a tunnel oxide layer on a semiconductor substrate, at least a portion of said tunnel oxide layer being made of one selected from the group consisting of $Y_2O_3$, $Al_2O_3$, $HfO_2$, and $ZrO_2$ with a conduction band energy level lower than that of $SiO_2$;

forming a floating gate on the tunnel oxide layer;

forming an intergate dielectric layer on the floating gate;

forming a control gate on the intergate dielectric layer;

forming a gate electrode by patterning the tunnel oxide layer, the floating gate, the intergate dielectric layer, and the control gate; and forming a source/drain region by performing an ion implantation into the substrate using the gate electrode as a mask.

2. The method as defined by claim 1, wherein forming the tunnel oxide layer comprises:

forming a first tunnel oxide layer on the semiconductor substrate; and forming a second tunnel oxide layer on the first tunnel oxide layer.

3. The method as defined by claim 2, wherein the first tunnel oxide layer is made of one selected from the group consisting of $Y_2O_3$, $Al_2O_3$, $HfO_2$, and $ZrO_2$ with a conduction band energy level lower than that of $SiO_2$.

4. The method as defined by claim 2, wherein the second tunnel oxide layer is made of one selected from the group consisting of $Y_2O_3$, $Al_2O_3$, and $SiO_2$ with a conduction band energy level equal or similar to that of $SiO_2$.

5. The method as defined by claim 2, wherein the first tunnel oxide layer is deposited more thickly than the second tunnel oxide layer.

* * * * *